AGC WITH COMPENSATION FOR CHANGE IN COLLECTOR CAPACITANCE
Filed April 2, 1962
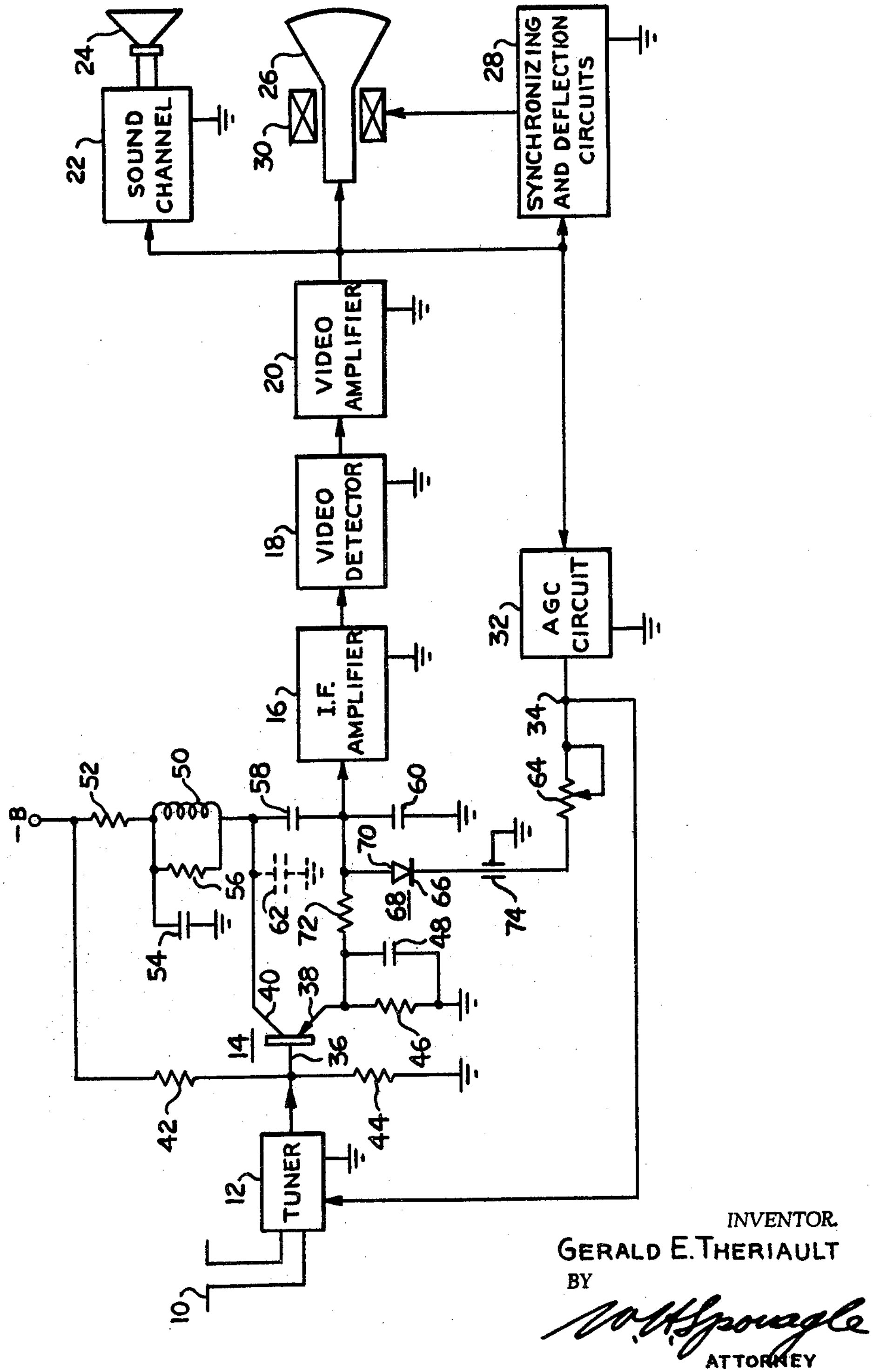
INVENTOR.
GERALD E. THERIAULT
BY
[signature]
ATTORNEY United States Patent Office 3,191,127
Patented June 22, 1965

3,191,127
AGC WITH COMPENSATION FOR CHANGE IN COLLECTOR CAPACITANCE

Gerald E. Theriault, Hopewell, N.J., assignor to Radio Corporation of America, a corporation of Delaware Filed Apr. 2, 1962, Ser. No. 184,210
4 Claims. (Cl. 330—24)

This invention relates to automatic gain control (AGC) circuits, and more particularly to AGC circuits for use with transistor signal amplifiers.

As is known, it is often necessary to automatically control the gain of signal amplifiers that are used in electronic systems in order that the systems may handle applied signals having large dynamic ranges. As an example, a television receiver may be required to reproduce a television image when the signal received at its antenna varies in strength in the range of 100 to 1, or more. The gain of the radio frequency and intermediate frequency amplifiers that are used in the receiver are automatically controlled so that the amplifiers have sufficient gain to properly amplify extremely weak signals, yet will not overload on strong signals.

If transistor amplifiers are to be used, particularly tuned amplifiers or wide band amplifiers, the problems associated with using an automatic gain control signal to change the gain of the transistor amplifier become difficult. Many problems are encountered, such as the change in input and output impedances of the amplifier under varying AGC control signals, and the change in the collector capacitance of the transistor, if the emitter current of the transistor is varied to provide AGC action.

Briefly, in accordance with the invention, a transistor amplifier, to which an automatic gain control signal is to be applied, includes a transistor in which the signal to be amplified is applied through an input circuit connected between the base and the emitter, and an amplified signal is derived from an output circuit connected between the collector and the emitter. The collector capacitance of the transistor shunts the output circuit and forms a part of the output circuit. An automatic gain control current is applied to the emitter electrode of the transistor such that a decrease in emitter current causes a decrease in the gain of the transistor amplifier. The change in emitter current, however, changes the collector capacitance of the transistor and the output impedance of the transistor. In order to compensate for these effects, a forwardly-biased, semiconductor diode is connected to be traversed by the AGC current to the transistor. The capacitance across the diode increases and its resistance decreases as the current in the forward direction increases. The diode is also connected into the output circuit of the transistor so that its changing capacitance with AGC current compensates for the changing collector capacitance, and its changing resistance tends to compensate for the change in output resistance of the transistor.

The invention may be better understood, however, when the following detailed description is read in connection with the accompanying drawing, the sole figure of which is a schematic circuit diagram, partly in block form, of a television receiver having an intermediate frequency amplifier circuit illustrating an embodiment of the invention.

The television receiver circuit, schematically illustrated in the drawing includes an antenna 10 to intercept and supply a received radio frequency (RF) television wave to a tuner 12 for the receiver. The RF television wave includes an RF picture wave, amplitude modulated with composite video signals, and an RF sound wave spaced 4.5 megacycles (mcs.) from the picture wave, in accordance with present broadcasting standards, and frequency modulated with sound signals. The received RF television wave is amplified and heterodyned to an intermediate frequency (IF) wave, including an IF picture wave and an IF sound wave, and applied to a first IF amplifier, which includes a transistor 14. The IF amplifier will be explained in greater detail hereinafter. The amplified wave from the first IF amplifier is applied to a further IF amplifier 16 and to a video detector 18. The video detector 18 demodulates the video information from the IF picture wave and provides an intercarrier sound wave from the beat between the picture and sound IF waves. The detected video signal and the intercarrier sound wave are applied to a video amplifier 20 and the intercarrier sound wave is applied to a sound channel 22 where it is amplified and demodulated to derive sound signals. The sound signals are applied to a loudspeaker 24 to reproduce the sound information contained in the received RF television wave.

Video signals from the video amplifier 20 are applied to the electron gun (not shown) of a cathode ray image reproducing tube 26 to modulate the intensity of the electron beam from the gun in accordance with the video signals, as is known.

The video signals are further applied to a synchronizing and deflection circuit 28 for the receiver which generates the proper currents to apply to an electromagnetic deflection yoke 30 for the cathode ray tube 26 to scan the electron beam of the cathode ray tube 26 in a television raster on its light reproducing screen (not shown).

The video signal is also applied from the video amplifier 20 to an AGC circuit 32 which generates at an AGC output terminal 34 an AGC current which increases in amplitude in response to an increase in amplitude of the video signals from the video amplifier 20.

The first intermediate frequency amplifier includes the transistor 14, which has a base 36, an emitter 38, and a collector 40. The IF wave from the tuner 12 is applied directly to the base 36. The base 36 is biased by being connected to the junction point of a voltage divider, comprising a first voltage divider resistor 42 and a second voltage divider resistor 44 connected in series between a source of negative operating voltage, —B, and ground, or other point of reference potential, for the receiver. The emitter 38 is connected to ground through an emitter resistor 46 shunted by a by-pass capacitor 48, to prevent signal degeneration across the emitter resistor 46.

The signal output circuit for the transistor 14 is tuned and includes an inductor 50 and a voltage dropping resistor 52 connected between the collector 40 and the source of operating potential, —B. The junction of the inductor 50 and the dropping resistor 52 is by-passed to ground at signal frequencies by a by-pass capacitor 54, and the inductor 50 is shunted by a resistor 56 to broaden the band of a tuned circuit. The tuning capacitance for the tuned circuit is provided by a pair of capacitors 58 and 60 connected in series between the collector 40 and ground for the receiver. The output signal from the circuit is taken from the junction of the capacitors 58, 60 and applied to the succeeding IF amplifier 16. The collector capacitance of the transistor 14 effectively shunts the load circuit and is shown as the dotted capacitor 62 connected between the collector 40 and ground for the receiver. The tuning capacitance for the inductor 50 thus also includes the collector capacitance 62.

AGC current from the terminal 34 may be applied to the tuner 12, as shown, and is applied from the terminal 34 to the emitter 38 of the transistor 14 through the series combination of a variable resistor 64, the cathode 66 of a semiconductor diode 68, the anode 70 of the diode 68, and an isolating resistor 72. The anode 70 of the diode 68 is also connected directly to the junction of the capacitors 58 and 60. A feed-through capacitor 74 is connected to the cathode of the point contact diode 68 and provides a low impedance by-pass between the cathode 66 of the diode 68 and ground for the receiver at signal frequencies. As is known, as the current through a semiconductor diode, such as diode 68, increases in the forward direction, the capacitance across it increases and its resistance decreases.

In operation, as AGC current is drawn from the emitter electrode 38 the collector capacitance 62 decreases, tending to increase the resonant frequency of the tuned output circuit. However, as the AGC current increases through the diode 68 its capacitance increases. Since the capacitance of the diode 68 is effectively connected across the capacitor 60, this action tends to reduce the resonant frequency of the output circuit and thus tends to maintain the tuning of the output circuit fixed, despite the fact that the collector capacitance 62 of the transistor 14 is decreasing with increasing AGC current.

The variable resistor 64 may be varied to adjust the effect of the capacitance change of the diode 68, and the dropping resistor 52 may be varied, if desired, to adjust the collector capacitance 62. Thus, tracking can be achieved between the decrease in the collector capacitance 62 with increasing AGC current, and the increase in capacitance of the diode 68 with increasing AGC current. As the AGC current increases, the output resistance of the amplifier also increases. This is compensated to some extent by the decrease in the resistance of the diode 68 with increasing AGC current.

What is claimed is:

1. In a signal amplifier system having a source of signals to be amplified and a source of gain control current, a transistor amplifier circuit, comprising, in combination:

a transistor having a base, an emitter, and a collector;

signal input circuit means for applying signals from said source of signals between the base and emitter of said transistor;

signal output circuit means for said transistor connected between the collector and emitter of said transistor, and including the collector capacitance of said transistor;

circuit means for applying said gain control current to the emitter of said transistor, including a semiconductor diode connected to be transversed by said gain control current in the forward direction; and means coupling said diode to said signal output circuit means to compensate for the decreasing collector capacitance of said transistor caused by an increase in gain control current, said compensation being effected by an increase in the capacitance of said diode with increasing gain control current.

2. A signal amplifier circuit, comprising, in combination:

a source of signals to be amplified;

a source of gain control current;

a transistor having a base, an emitter, and a collector;

signal input circuit means coupling said source of signals between the base and emitter of said transistor;

signal output circuit means connected between the collector and emitter of said transistor, and including the collector capacitance of said transistor;

circuit means including a semiconductor diode connected to be traversed by said gain control current in the forward direction, coupled between said source of gain control current and the emitter of said transistor; and further means coupling said diode to said signal output circuit means to compensate for the decrease in collector capacitance of said transistor caused by an increase in gain control current, said compensation being effected by an increase in the capacitance of said diode with an increase in gain control current.

3. In a signal amplifier system having a source of signals to be amplified and a source of gain control current, a transistor amplifier circuit, comprising, in combination:

a transistor having a base, an emitter, and a collector;

a signal input circuit connected between the base and emitter of said transistor for applying signals from said source of signals thereto;

a signal output circuit connected between the collector and emitter of said transistor, and including the collector capacitance of said transistor; and means including a forward-biased, semiconductor diode connected to said emitter for applying said gain control current to said emitter, said diode also being connected to said signal output circuit for compensating for the change in collector capacitance of said transistor and the change in output resistance of said transistor caused by changes in gain control current, said compensation being effected by a complementary change in the capacitance and resistance of said diode with changes in gain control current.

4. In a signal amplifier system having a sourse of signals to be amplified and a source of automatic gain control current, a transistor amplifier circuit comprising, in combination:

a transistor having a base, an emitter, and a collector;

signal input means for applying signals from said source of signals between the base and emitter of said transistor;

a tuned signal output circuit means connected between the collector and emitter of said transistor, and including the collector capacitance of said transistor;

circuit means for applying said automatic gain control current to the emitter of said transistor, including a semiconductor diode connected to be traversed by said automatic gain control current in the forward direction; and means coupling said diode to said tuned signal output circuit means to compensate for the change in collector capacitance of said transistor caused by a change in automatic gain control current, said compensation being effected by a complementary change in the capacitance of said semiconductor diode with a change in automatic gain control current to maintain the tuning of said tuned signal output circuit means constant despite changes in the automatic gain control current.

References Cited by the Examiner

UNITED STATES PATENTS 2,836,713 5/58 Scott et al. ---------- 330—29 X

OTHER REFERENCES

Lane, Richard: "A Synchronously Tuned 60 MC I.F. Amplifier With A.G.C."; application data—Fairchild Semiconductor Corp., APP–26 (14 pages); received May 8, 1961.

Hammerslag: "Circuit Design Using Silicon Capacitors," Electronics, Sept. 18, 1959, pages 48–50.

ROY LAKE, *Primary Examiner.*

JOHN KOMINSKI, *Examiner.*